(12) United States Patent
Xu et al.

(10) Patent No.: US 11,510,313 B2
(45) Date of Patent: Nov. 22, 2022

(54) ELECTRONIC DEVICE AND METHOD FOR MANUFACTURING ELECTRONIC DEVICE

(71) Applicant: TPK Advanced Solutions Inc., Fujian (CN)

(72) Inventors: Xian-Bin Xu, Xiamen (CN); Ming-Qiang Fu, Liancheng County (CN); He Luo, Longchang (CN); Chen-Hsin Chang, Taoyuan (TW)

(73) Assignee: TPK Advanced Solutions Inc., Fujian (CN)

( * ) Notice: Subject to any disclaimer, the term of this patent is extended or adjusted under 35 U.S.C. 154(b) by 0 days.

(21) Appl. No.: 17/096,034

(22) Filed: Nov. 12, 2020

(65) Prior Publication Data
US 2022/0151062 A1     May 12, 2022

(51) Int. Cl.
*H05K 1/02* (2006.01)
*H05K 3/10* (2006.01)

(52) U.S. Cl.
CPC ........... *H05K 1/0296* (2013.01); *H05K 1/028* (2013.01); *H05K 3/10* (2013.01)

(58) Field of Classification Search
CPC ........ H05K 1/0296; H05K 1/028; H05K 3/10; H05K 1/02
USPC ........................................................ 174/254
See application file for complete search history.

(56) References Cited

U.S. PATENT DOCUMENTS

2005/0093151 A1* 5/2005 Swanson ................. H01L 24/10
257/738
2021/0272905 A1* 9/2021 Karhade ............. H01L 23/5385

FOREIGN PATENT DOCUMENTS

TW         I672774 B    9/2019
TW         M608035 U    2/2021

* cited by examiner

*Primary Examiner* — Tremesha S Willis
(74) *Attorney, Agent, or Firm* — Cooper Legal Group, LLC (57) ABSTRACT

An electronic device includes a substrate and a flexible printed circuit board. The substrate includes a plurality of first pins disposed on the substrate. The flexible printed circuit board includes a plurality of second pins disposed on the flexible printed circuit board. The first pins and the second pins are bonded to each other to form a plurality of bonding points. The bonding points include at least one central bonding point and at least one first bonding point. The at least one central bonding point is located in a central area of the electronic device. The at least one first bonding point is located in a first area of the electronic device. The first area is located outside the central area. A line width of the at least one first bonding point is greater than a line width of the at least one central bonding point.

20 Claims, 5 Drawing Sheets

ELECTRONIC DEVICE AND METHOD FOR MANUFACTURING ELECTRONIC DEVICE

BACKGROUND

Field of Disclosure

The present disclosure relates to an electronic device and a method. More particularly, the present disclosure relates to an electronic device comprising a touch panel and a method for manufacturing an electronic device.

Description of Related Art

The bonding area of the prior art touch panel is designed with equal line width and equal line spacing. The equal line width and equal line spacing are designed according to the maximum common difference of the product, so a sufficient design space is required.

However, with the development of ultra-thin flexible substrate technology, it is impossible to solve the problem of increasing common difference as the length of the bonding area in the product increases.

For the foregoing reason, there is a need to provide some other suitable pin design method to solve the problems of the prior art.

SUMMARY

One aspect of the present disclosure provides an electronic device. The electronic device comprises a substrate and a flexible printed circuit board. The substrate comprises a plurality of first pins. The plurality of first pins are disposed on the substrate. The flexible printed circuit board comprises a plurality of second pins. The plurality of second pins are disposed on the flexible printed circuit board. The plurality of first pins and the plurality of second pins are bonded to each other to form a plurality of bonding points. The plurality of bonding points comprise at least one central bonding point and at least one first bonding point. The at least one central bonding point is located in a central area of the electronic device. The at least one first bonding point is located in a first area of the electronic device. The first area is located outside the central area. A line width of the at least one first bonding point is greater than a line width of the at least one central bonding point.

In the foregoing, the at least one central bonding point comprises a plurality of central bonding points. The line width of each of the plurality of central bonding points is equal.

In the foregoing, the at least one first bonding point comprises a plurality of first bonding points. The line width of each of the plurality of first bonding points is equal.

In the foregoing, a difference between the line width of each of the plurality of central bonding points and the line width of each of the plurality of first bonding points is equal. The difference between the line width of each of the plurality of central bonding points and the line width of each of the plurality of first bonding points is between 0 μm and 25 μm.

In the foregoing, a spacing between two adjacent central bonding points of the plurality of central bonding points is equal. A spacing between two adjacent first bonding points of the plurality of first bonding points is equal.

In the foregoing, the spacing between two adjacent central bonding points of the plurality of central bonding points and the spacing between two adjacent first bonding points of the plurality of first bonding points are smaller than or equal to 380 μm.

In the foregoing, each of the plurality of central bonding points and each of the plurality of first bonding points are arranged on a same straight line.

In the foregoing, the electronic device comprises a first side and a second side. The second side is opposite to the first side. The first area is disposed adjacent to the central area and is located at a position between the central area and the first side.

In the foregoing, the electronic device comprises a first side and a second side. The second side is opposite to the first side. The central area and the first area are arranged in an arrangement sequence from the second side to the first side of the electronic device.

In the foregoing, a length of the central area and a length of first area are between 4.75 mm and 5.25 mm.

In the foregoing, the plurality of bonding points further comprise at least one second bonding point located in a second area of the electronic device. The second area is located outside the first area. A line width of the at least one second bonding point is greater than the line width of the at least one first bonding point.

In the foregoing, the line width of the at least one central bonding point, the line width of the at least one first bonding point, and the line width of the at least one second bonding point present an arithmetic distribution. A common difference between the line width of the at least one central bonding point, the line width of the at least one first bonding point, and the line width of the at least one second bonding point is between 0 μm and 25 μm.

In the foregoing, the line width of the at least one central bonding point, the line width of the at least one first bonding point, and the line width of the at least one second bonding point are increased or decreased with the common difference.

In the foregoing, a first spacing between the at least one central bonding point and the at least one first bonding point and a second spacing between the at least one first bonding point and the at least one second bonding point are both smaller than or equal to 380 μm.

In the foregoing, the at least one central bonding point, the at least one first bonding point, and the at least one second bonding point are arranged on a same straight line.

In the foregoing, the electronic device comprises a first side and a second side. The second side is opposite to the first side. The at least one first bonding point comprises two first bonding points. The two first bonding points are respectively disposed in two first areas of the electronic device. The at least one second bonding point comprises two second bonding points. The two second bonding points are respectively disposed in two second areas of the electronic device. One of the two second areas, one of the two first areas, the central area, another one of the two first areas, and another one of the two second areas are arranged in an arrangement sequence from the second side to the first side of the electronic device.

In the foregoing, a length of each of the first area and the second area is between 4.75 mm and 5.25 mm, and a length of the central area is between 9.5 mm and 10.5 mm.

Another aspect of the present disclosure provides a method for manufacturing an electronic device. The method for manufacturing the electronic device comprises the following steps: disposing a plurality of first pins on a substrate; disposing a plurality of second pins on a flexible printed circuit board; and bonding the plurality of first pins and the plurality of second pins to each other to form at least one central bonding point in a central area of the electronic device and form at least one first bonding point in a first area of the electronic device. The first area is located outside the central area. A line width of the at least one first bonding point is greater than a line width of the at least one central bonding point.

In the foregoing, the step of bonding the plurality of first pins and the plurality of second pins to each other comprises bonding the plurality of first pins and the plurality of second pins to each other to form the at least one central bonding point in the central area of the electronic device, form the at least one first bonding point in the first area of the electronic device, and form at least one second bonding point in a second area of the electronic device. The second area is located outside the first area. A line width of the at least one second bonding point is greater than the line width of the at least one first bonding point.

In the foregoing, the step of bonding the plurality of first pins and the plurality of second pins to each other further comprises bonding the plurality of first pins and the plurality of second pins to each other so that the line width of the at least one central bonding point, the line width of the at least one first bonding point, and the line width of the at least one second bonding point present an arithmetic distribution.

In summary, the present disclosure provides an electronic device and a method for manufacturing an electronic device to improve the problem of increasing common difference as the length of the bonding area in the ultra-thin flexible substrate increases. In addition to that, the bonding accuracy can be improved.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise.

Furthermore, it should be understood that the terms, "comprising", "including", "having", "containing", "involving" and the like, used herein are open-ended, that is, including but not limited to.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

Figure 1:
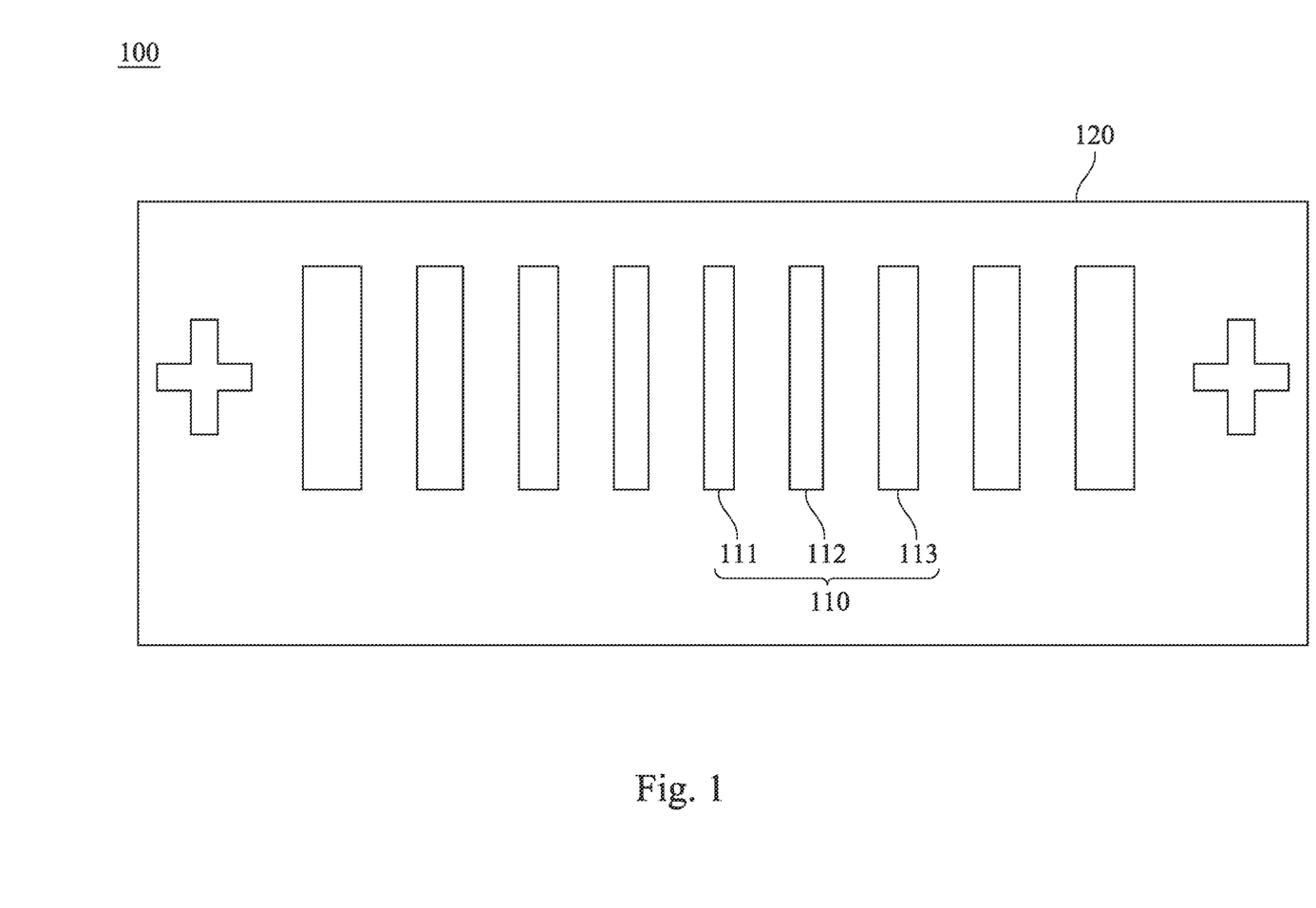
FIG. 1 depicts a pin diagram of a substrate according to some embodiments of the present disclosure.
Figure 2:
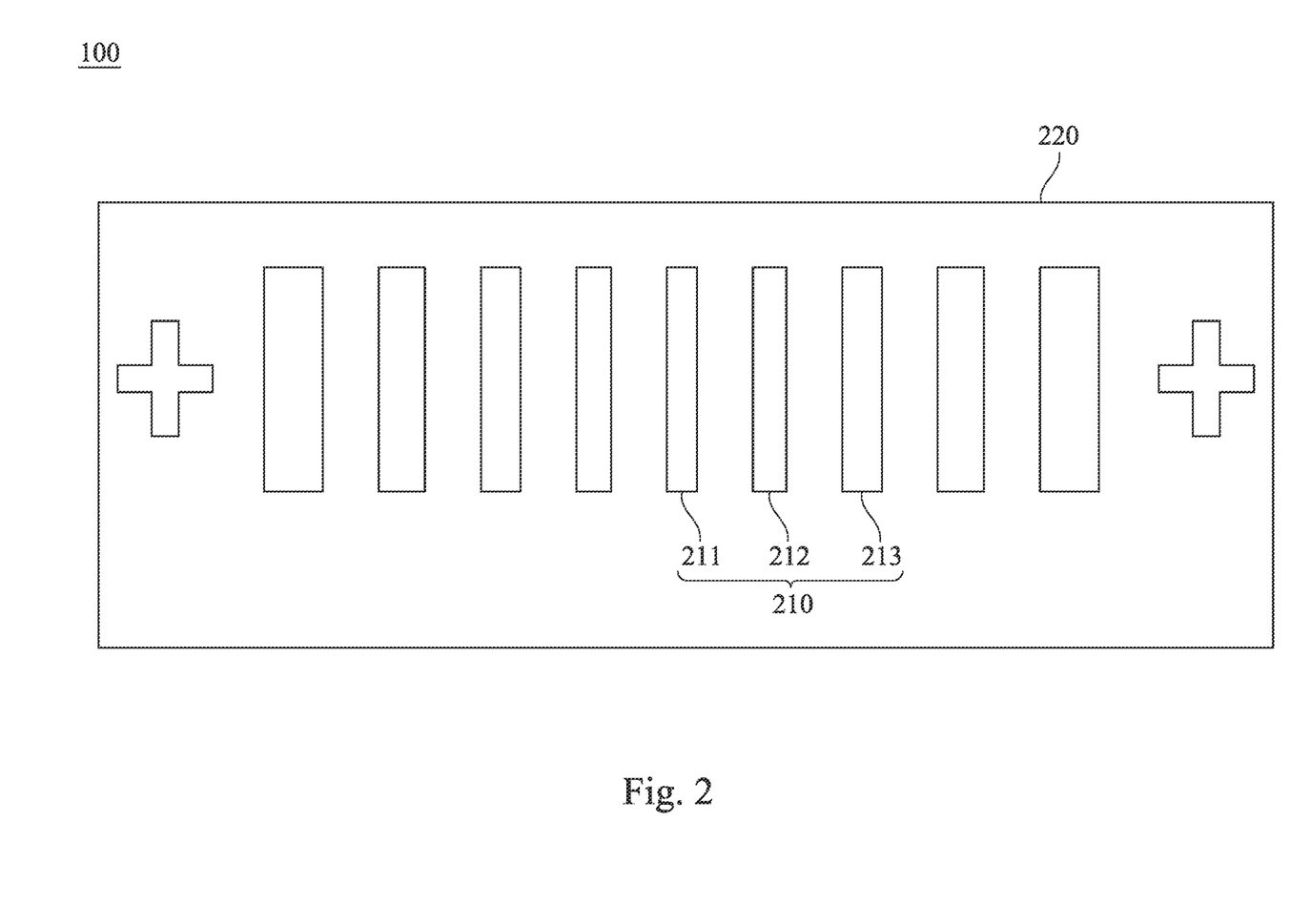
FIG. 2 depicts a pin diagram of a flexible printed circuit board according to some embodiments of the present disclosure.
Figure 3:
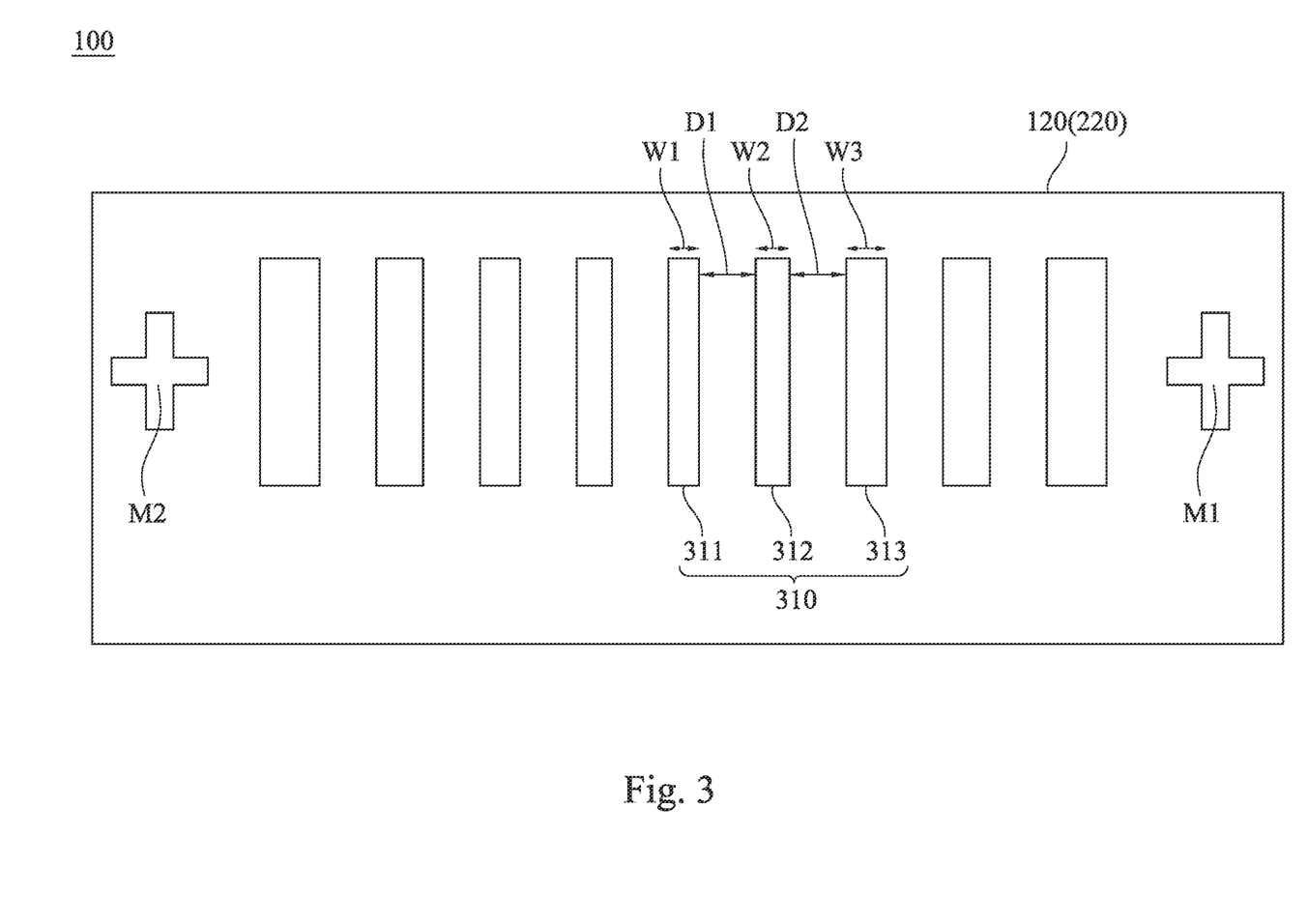
FIG. 3 depicts a schematic diagram of bonding points according to some embodiments of the present disclosure.

In some embodiments, in order to facilitate an understanding of a structure of an electronic device 100 according to the present disclosure, a description is provided with reference to FIG. 1 to FIG. 3. FIG. 1 depicts a pin diagram of a substrate according to some embodiments of the present disclosure. FIG. 2 depicts a pin diagram of a flexible printed circuit board according to some embodiments of the present disclosure. FIG. 3 depicts a schematic diagram of bonding points according to some embodiments of the present disclosure. A description is provided with reference to FIG. 1 to FIG. 3. The electronic device 100 comprises a substrate 120 and a flexible printed circuit board 220. In some embodiments, the electronic device 100 may be a panel or a display device.

A description is provided with reference to FIG. 1. The substrate 120 comprises a plurality of first pins 110. A description is provided with reference to FIG. 2. The flexible printed circuit board 220 comprises a plurality of second pins 210.

In some embodiments, the plurality of first pins 110 comprise pins of different line widths as shown in FIG. 1, for example, pins 111, pins 112, and pins 113, as shown in FIG. 1.

In some embodiments, the plurality of second pins 210 comprise pins of different line widths as shown in FIG. 2, for example, pins 211, pins 212, and pins 213, as shown in FIG. 2.

Figure 4:
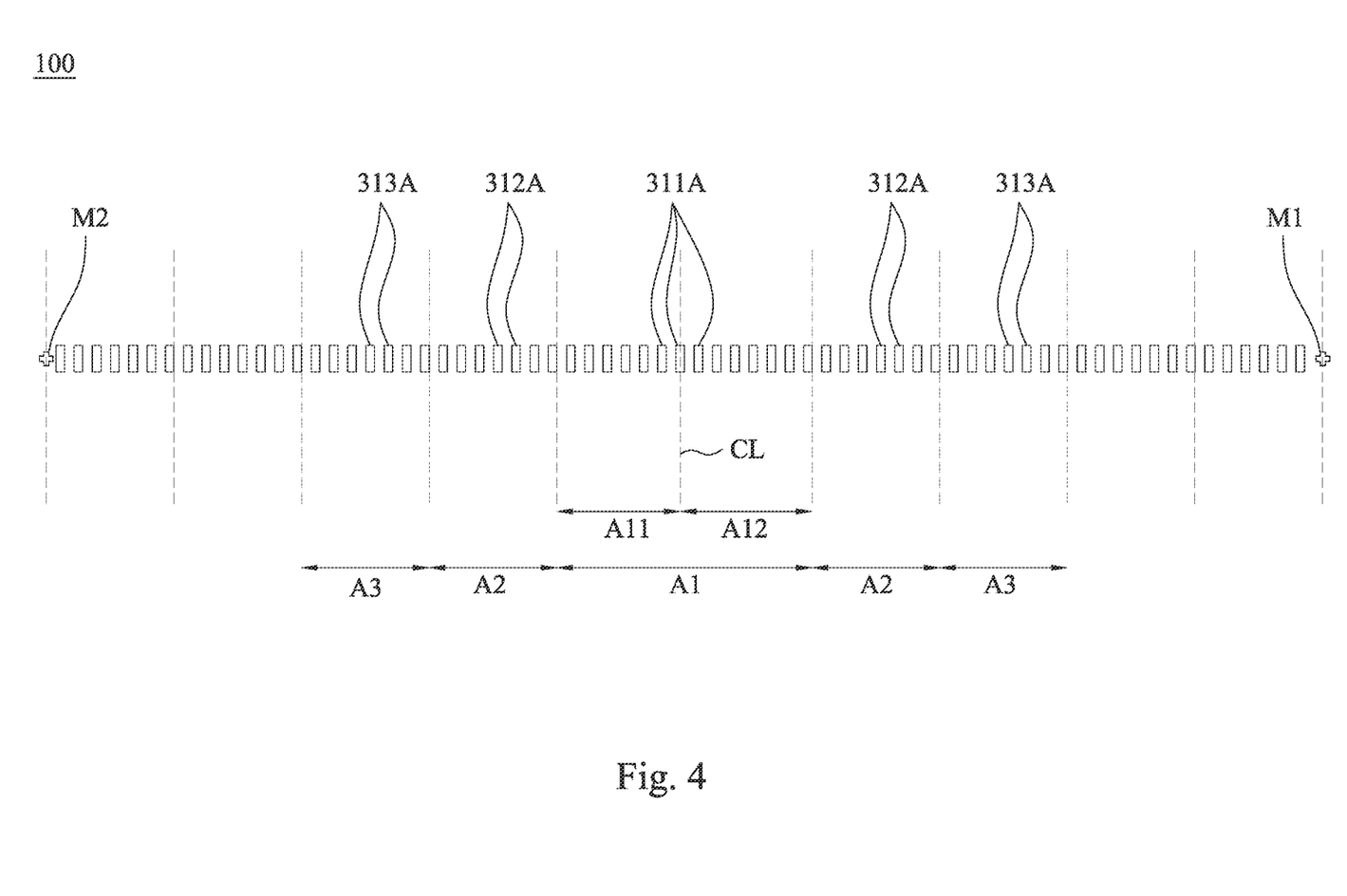
FIG. 4 depicts a schematic diagram of the bonding points of a modified embodiment of the embodiment shown in FIG. 3 according to the present disclosure.

In some embodiments, in order to facilitate the understanding of the structure of the electronic device 100 according to the present disclosure, a description is provided with reference to FIG. 3 to FIG. 4. FIG. 4 depicts a schematic diagram of the bonding points of a modified embodiment of the embodiment shown in FIG. 3 according to the present disclosure.

In some embodiments, a description is first provided with reference to FIG. 3. FIG. 3 depicts a basic structure of the bonding points according to the present disclosure. As shown in the figure, a plurality of bonding points 310 comprise at least one central bonding point 311 and at least one first bonding point 312. A line width of the at least one central bonding point 311 is W1. A line width of the at least one first bonding point 312 is W2. The line width W2 of the at least one first bonding point 312 is greater than the line width W1 of the at least one central bonding point 311. A first spacing between the at least one central bonding point 311 and the at least one first bonding point 312 is D1.

Based on the basic structure of the bonding points depicted in FIG. 3, FIG. 4 depicts a more complete application example of the bonding points of the modified embodiment of the embodiment shown in FIG. 3 according to the present disclosure. As shown in the figure, at least one central bonding point 311A is located in a central area A1 of the electronic device 100. At least one first bonding point 312A is located in a first area A2 of the electronic device 100. The first area A2 is located outside the central area A1. Similar to the basic structure of the bonding points depicted in FIG. 3, the line width W2 of the at least one first bonding point 312A located in the first area A2 is similarly greater than the line width W1 of the at least one central bonding point 311A located in the central area A1.

A description is provided with reference to FIG. 4. In some embodiments, the at least one central bonding point 311A comprises a plurality of central bonding points 311A and is located in the central area A1. The line width W1 of each of the plurality of central bonding points 311A is equal. In some embodiments, the line width W1 of each of the plurality of central bonding points 311A is greater than or equal to 380 μm.

In some embodiments, the at least one first bonding point 312A comprises a plurality of first bonding points 312A and is located in the first area A2. The line width W2 of each of the plurality of first bonding points 312A is equal.

In some embodiments, a difference between the line width W1 of each of the plurality of central bonding points 311A and the line width W2 of each of the plurality of first bonding points 312A is equal. In addition, the difference between the line width W1 of each of the plurality of central bonding points 311A and the line width W2 of each of the plurality of first bonding points 312A is between 0 μm and 25 μm.

In some embodiments, a spacing between two adjacent central bonding points 311A in the plurality of central bonding points 311A is equal. In some embodiments, a spacing between two adjacent first bonding points 312A in the plurality of first bonding points 312A is equal.

In some embodiments, the spacing between two adjacent central bonding points 311A in the plurality of central bonding points 311A and the spacing between two adjacent first bonding points 312A in the plurality of first bonding points 312A are smaller than or equal to 380 μm.

In some embodiments, each of the plurality of central bonding points 311A and each of the plurality of first bonding points 312A are arranged on a same straight line.

In some embodiments, the electronic device 100 comprises a first side M1 and a second side M2. The second side M2 is opposite to the first side M1. It is noted that although in FIG. 4 the first side M1 and the second side M2 are depicted as a left side and a right side, in practice the first side M1 and the second side M2 are not limited to the left side and the right side. Additionally, here a structure along a direction extending from the central line CL towards the first side M1 is taken as an example for illustration. The first area A2 is disposed adjacent to a central area A12 and is located at a position adjacent to the central area A12 and close to the first side M1.

In some embodiments, the electronic device 100 comprises the first side M1 and the second side M2. The second side M2 is opposite to the first side M1. The central area A12 and the first area A2 are arranged in an arrangement sequence from the second side M2 to the first side M1 of the electronic device 100.

In some embodiments, a length of the central area A12 (measured in the same direction as the line widths W1, W2, and W3 are measured) is equal to a length (measured in the same direction as the line widths W1, W2, and W3 are measured) of the first area A2. In some embodiments, the length of the central area A12 and the length of first area A2 are between 4.75 mm and 5.25 mm.

A description is provided with reference to FIG. 3. In some embodiments, the plurality of bonding points 310 further comprise at least one second bonding point 313. A line width of the at least one second bonding point 313 is W3. The line width W3 of the at least one second bonding point 313 is greater than the line width W2 of the at least one first bonding point 312. A second spacing between the at least one first bonding point 312 and the at least one second bonding point 313 is D2.

Similarly, based on the basic structure of the bonding points depicted in FIG. 3, FIG. 4 depicts the bonding points of the modified embodiment of the embodiment shown in FIG. 3. As shown in the figure, at least one second bonding point 313A comprises a plurality of second bonding points 313A and is located in a second area A3 of the electronic device 100. The second area A3 is located outside the first area A2. Similar to the basic structure of the bonding points depicted in FIG. 3, the line width W3 of the at least one second bonding point 313A located in the second area A3 is greater than the line width W2 of the at least one first bonding point 312A located in the first area A2.

In some embodiments, the line width W1 of the at least one central bonding point 311A, the line width W2 of the at least one first bonding point 312A, and the line width W3 of the at least one second bonding point 313A present an arithmetic distribution. A common difference between the line width W1 of the at least one central bonding point 311A, the line width W2 of the at least one first bonding point 312A, and the line width W3 of the at least one second bonding point 313A is between 0 μm and 25 μm.

In some embodiments, the line width W1 of the at least one central bonding point 311A, the line width W2 of the at least one first bonding point 312A, and the line width W3 of the at least one second bonding point 313A are increased or decreased with the common difference.

It is noted that the slight differences between the line widths in the areas of FIG. 4 are difficult to be presented when the figure is depicted. In fact, the line widths of FIG. 4 show the modified embodiment based on the embodiment shown in FIG. 3, in which the line widths are increased or decreased with the common difference.

In some embodiments, the first spacing D1 between the at least one central bonding point 311A and the at least one first bonding point 312A is equal to the second spacing D2 between the at least one first bonding point 312A and the at least one second bonding point 313A. In some embodiments, both the first spacing D1 and the second spacing D2 are smaller than or equal to 380 μm.

In some embodiments, the at least one central bonding point 311A, the at least one first bonding point 312A, and the at least one second bonding point 313A are arranged on the same straight line.

In some embodiments, the electronic device 100 comprises the first side M1 and the second side M2. The second side M2 is opposite to the first side M1. The at least one first bonding point 312A comprises two first bonding points 312A, and the first bonding points 312A are respectively disposed in two first areas A2 of the electronic device 100. The at least one second bonding point 313A comprises two second bonding points 313A, and the second bonding points 313A are respectively disposed in two second areas A3 of the electronic device 100. It is noted that here an overall structure of FIG. 4 is used for illustration. The second area A3, the first area A2, the central area A1, the first area A2, and the second area A3 are arranged in an arrangement sequence from the second side M2 to the first side M1 of the electronic device 100 is.

In some embodiments, when taking into consideration the overall structure of FIG. 4, the length of the first area A2 is equal to a length of the second area A3, and a length of the central area A1 is respectively two times the length of the first area A2 and the length of the second area A3. In some embodiments, the length of first area A2 and the length of the second area A3 are between 4.75 mm and 5.25 mm. The length of the central area A1 is between 9.5 mm and 10.5 mm.

Figure 5:
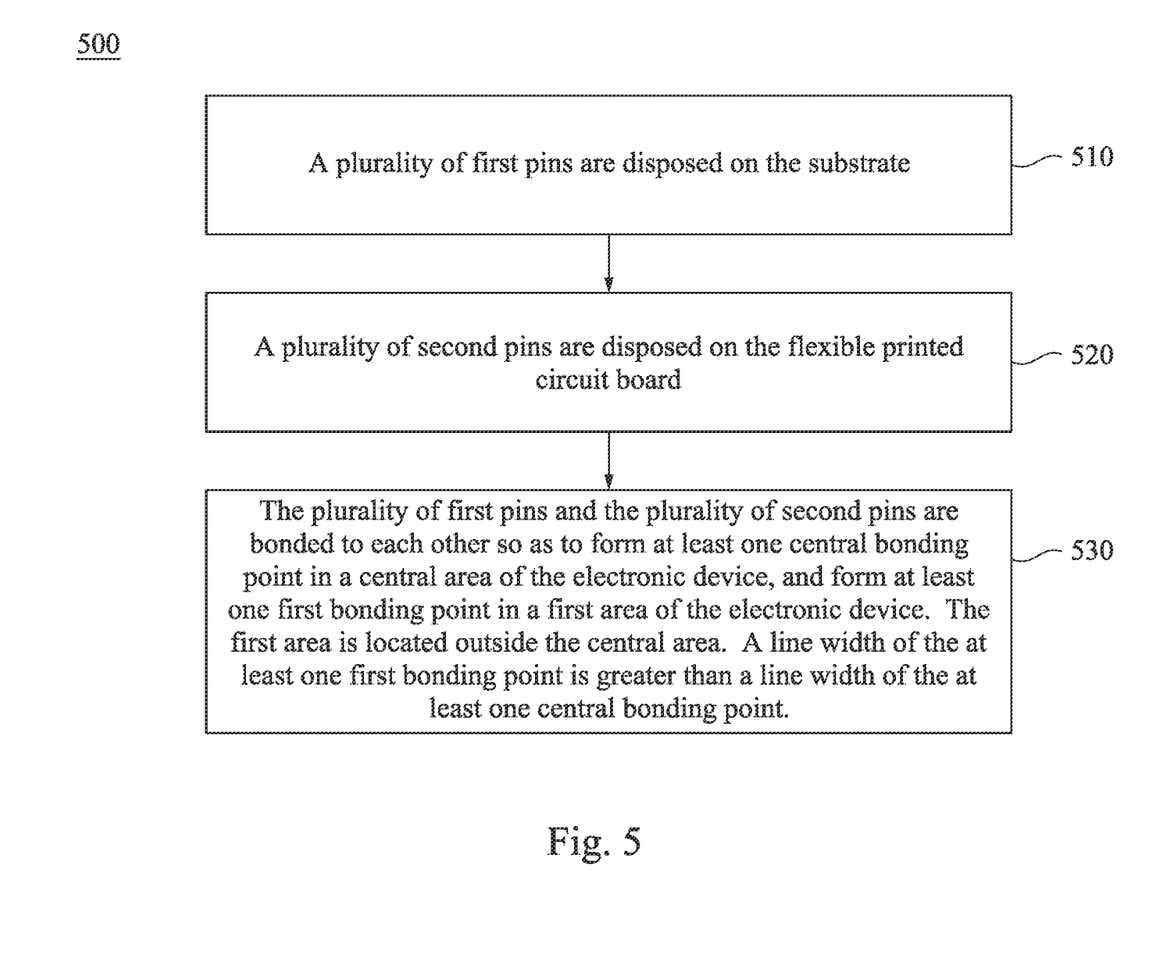
FIG. 5 depicts a flowchart of steps of a method for manufacturing an electronic device according to some embodiments of the present disclosure.

FIG. 5 depicts a flowchart of steps of a method for manufacturing an electronic device according to some embodiments of the present disclosure. In some embodiments, the method for manufacturing the electronic device 500 is used to bond a substrate (such as the substrate 120 of FIG. 1) and a flexible printed circuit board (such as the flexible printed circuit board 220 of FIG. 2) to each other so as to form a plurality of bonding points (such as the plurality of bonding points 310 shown in FIG. 3).

In step 510, a plurality of first pins are disposed on the substrate.

For example, a description is provided with reference to FIG. 1. The plurality of first pins 110 are disposed on the substrate 120.

In step 520, a plurality of second pins are disposed on the flexible printed circuit board.

For example, a description is provided with reference to FIG. 2. The plurality of second pins 210 are disposed on the flexible printed circuit board 220.

In step 530, the plurality of first pins and the plurality of second pins are bonded to each other so as to form at least one central bonding point in a central area of the electronic device and form at least one first bonding point in a first area of the electronic device. The first area is located outside the central area. A line width of the at least one first bonding point is greater than a line width of the at least one central bonding point.

For example, a description is provided with reference to FIG. 1 to FIG. 4. The plurality of first pins 110 and the plurality of second pins 210 are bonded to each other so as to form the at least one central bonding point 311A in the central area A1 of the electronic device 100 and form the at least one first bonding point 312A in a first area A2 of the electronic device 100. The first area A2 is located outside the central area A1. The line width W2 of the at least one first bonding point 312A is greater than the line width W1 of the at least one central bonding point 311A.

In some embodiments, the above step 530 comprises the following operation: bonding the plurality of first pins and the plurality of second pins to each other so as to form the at least one central bonding point in the central area of the electronic device, form the at least one first bonding point in the first area of the electronic device, and form at least one second bonding point in a second area of the electronic device. The second area is located outside the first area. A line width of the at least one second bonding point is greater than the line width of the at least one first bonding point.

For example, a description is provided with reference to FIG. 1 to FIG. 4. The plurality of first pins 110 and the plurality of second pins 210 are bonded to each other so as to form the at least one central bonding point 311A in the central area A1 of the electronic device 100, form the at least one first bonding point 312A in the first area A2 of the electronic device 100, and form the at least one second bonding point 313A in the second area A3 of the electronic device 100. The second area A3 is located outside the first area A2. The line width W3 of the at least one second bonding point 313A is greater than the line width W2 of the at least one first bonding point 312A.

In some embodiments, the above step 530 further comprises the following operation: bonding the plurality of first pins and the plurality of second pins to each other so that the line width of the at least one central bonding point, the line width of the at least one first bonding point, and the line width of the at least one second bonding point present an arithmetic distribution.

For example, a description is provided with reference to FIG. 1 to FIG. 4. The plurality of first pins 110 and the plurality of second pins 210 are bonded to each other so that the line width W1 of the at least one central bonding point 311A, the line width W2 of the at least one first bonding point 312A, and the line width W3 of the at least one second bonding point 313A present the arithmetic distribution.

In some embodiments, a description is provided with reference to FIG. 4. A bonding area is between the first side M1 and the second side M2. In practice, a length of the bonding area is 50.43 mm. After adopting the method for manufacturing the electronic device 500 according to the present disclosure, the length of the bonding area is shortened from 50.43 mm to 49.79 mm, which makes the design space 0.64 mm larger.

Based on the above embodiments, the present disclosure provides an electronic device and a method for manufacturing an electronic device to improve the problem of increasing common difference as the length of the bonding area in the ultra-thin flexible substrate increases. In addition to that, the bonding accuracy can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An electronic device, comprising:
a substrate, comprising:
a plurality of first pins disposed on the substrate; and
a flexible printed circuit board, comprising:
a plurality of second pins disposed on the flexible printed circuit board;
wherein the first pins and the second pins are directly bonded to each other to form a plurality of bonding points, the bonding points comprise:
at least one central bonding point located in a central area of the electronic device;
at least one first bonding point located in a first area of the electronic device, wherein the first area is located outside the central area, and wherein a line width of the at least one first bonding point is greater than a line width of the at least one central bonding point; and
at least one second bonding point located in a second area of the electronic device, wherein the second area is located outside the first area, and wherein a line width of the at least one second bonding point is greater than the line width of the at least one first bonding point.

2. The electronic device of claim 1, wherein the at least one central bonding point comprises a plurality of central bonding points, and wherein the line width of each of the central bonding points is equal.

3. The electronic device of claim 2, wherein the at least one first bonding point comprises a plurality of first bonding points, and wherein the line width of each of the first bonding points is equal.

4. The electronic device of claim 3, wherein a difference between the line width of each of the central bonding points and the line width of each of the first bonding points is equal, and wherein the difference between the line width of each of the central bonding points and the line width of each of the first bonding points is between 0 μm and 25 μm.

5. The electronic device of claim 4, wherein a spacing between every two adjacent central bonding points of the central bonding points is equal, and wherein a spacing between every two adjacent first bonding points of the first bonding points is equal.

6. The electronic device of claim 5, wherein the spacing between every two adjacent central bonding points of the central bonding points and the spacing between every two adjacent first bonding points of the first bonding points are smaller than or equal to 380 μm.

7. The electronic device of claim 1, wherein each of the central bonding points and each of the first bonding points are arranged on a same straight line.

8. The electronic device of claim 1, wherein the electronic device comprises a first side and a second side, wherein the second side is opposite to the first side, and wherein the first area is disposed adjacent to the central area and is located at a position between the central area and the first side.

9. The electronic device of claim 1, wherein the electronic device comprises a first side and a second side, wherein the second side is opposite to the first side, and wherein the central area and the first area are arranged in an arrangement sequence from the second side to the first side of the electronic device.

10. The electronic device of claim 1, wherein a length of the central area and a length of first area are between 4.75 mm and 5.25 mm.

11. The electronic device of claim 1, wherein the line width of the at least one central bonding point, the line width of the at least one first bonding point, and the line width of the at least one second bonding point present an arithmetic distribution, and wherein a common difference between the line width of the at least one central bonding point, the line width of the at least one first bonding point, and the line width of the at least one second bonding point is between 0 μm and 25 μm.

12. The electronic device of claim 11, wherein the line width of the at least one central bonding point, the line width of the at least one first bonding point, and the line width of the at least one second bonding point are increased or decreased with the common difference.

13. The electronic device of claim 12, wherein a first spacing between the at least one central bonding point and the at least one first bonding point and a second spacing between the at least one first bonding point and the at least one second bonding point are both smaller than or equal to 380 μm.

14. The electronic device of claim 11, wherein the at least one central bonding point, the at least one first bonding point, and the at least one second bonding point are arranged on a same straight line.

15. The electronic device of claim 11, wherein the electronic device comprises a first side and a second side, wherein the second side is opposite to the first side, wherein the at least one first bonding point comprises two first bonding points, wherein the two first bonding points are respectively disposed in two first areas of the electronic device, wherein the at least one second bonding point comprises two second bonding points, wherein the two second bonding points are respectively disposed in two second areas of the electronic device, wherein one of the two second areas, one of the two first areas, the central area, another one of the two first areas, and another one of the two second areas are arranged in an arrangement sequence from the second side to the first side of the electronic device.

16. The electronic device of claim 1, wherein a length of each of the first area and the second area is between 4.75 mm and 5.25 mm, and a length of the central area is between 9.5 mm and 10.5 mm.

17. A method for manufacturing an electronic device, comprising:
    disposing a plurality of first pins on a substrate;
    disposing a plurality of second pins on a flexible printed circuit board; and
    bonding the first pins and the second pins to each other to form at least one central bonding point in a central area of the electronic device, form at least one first bonding point in a first area of the electronic device, and form at least one second bonding point located in a second area of the electronic device, wherein the first pins are directly bonded to the second pins, wherein the first area is located outside the central area, wherein a line width of the at least one first bonding point is greater than a line width of the at least one central bonding point, wherein the second area is located outside the first area, and wherein a line width of the at least one second bonding point is greater than the line width of the at least one first bonding point.

18. The method for manufacturing the electronic device of claim 17, wherein the step of bonding the first pins and the second pins to each other further comprises:
    bonding the first pins and the second pins to each other so that the line width of the at least one central bonding point, the line width of the at least one first bonding point, and the line width of the at least one second bonding point present an arithmetic distribution.

19. The electronic device of claim 1, wherein a first spacing between the at least one central bonding point and the at least one first bonding point and a second spacing between the at least one first bonding point and the at least one second bonding point are equal.

20. An electronic device, comprising:
    a substrate, comprising:
        a plurality of first pins disposed on the substrate; and
    a flexible printed circuit board, comprising:
        a plurality of second pins disposed on the flexible printed circuit board;
    wherein the first pins and the second pins are bonded to each other to form a plurality of bonding points, the bonding points comprise:
        at least one central bonding point located in a central area of the electronic device;
        at least one first bonding point located in a first area of the electronic device, wherein the first area is located outside the central area, and wherein a line width of the at least one first bonding point is greater than a line width of the at least one central bonding point; and
        at least one second bonding point located in a second area of the electronic device, wherein the second area is located outside the first area, wherein the first area is laterally between the central area and the second area, and wherein a line width of the at least one second bonding point is greater than the line width of the at least one first bonding point.

* * * * *